United States Patent
Zeng

(10) Patent No.: US 11,789,502 B2
(45) Date of Patent: Oct. 17, 2023

(54) SERVER CASING AND SERVER DEVICE

(71) Applicants: SQ Technology(Shanghai) Corporation, Shanghai (CN); INVENTEC CORPORATION, Taipei (TW)

(72) Inventor: Boheng Zeng, Shanghai (CN)

(73) Assignees: SQ Technology(Shanghai) Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/693,512

(22) Filed: Mar. 14, 2022

(65) Prior Publication Data

US 2023/0081807 A1    Mar. 16, 2023

(30) Foreign Application Priority Data

Sep. 10, 2021 (CN) .......................... 202111064006.1

(51) Int. Cl.
*H05K 7/14* (2006.01)
*G06F 1/18* (2006.01)

(52) U.S. Cl.
CPC .......... *G06F 1/181* (2013.01); *H05K 7/1492* (2013.01)

(58) Field of Classification Search
CPC ........ G06F 1/181; G06F 1/183; H05K 7/1492
See application file for complete search history.

(56) References Cited

U.S. PATENT DOCUMENTS

| 9,693,477 B1* | 6/2017 | Ehlen | H05K 7/1492 |
| 2015/0359131 A1* | 12/2015 | Moore | H05K 7/1488 |
| | | | 211/183 |
| 2021/0201435 A1* | 7/2021 | Ni | G06F 1/181 |

* cited by examiner

*Primary Examiner* — James Wu
(74) *Attorney, Agent, or Firm* — Locke Lord LLP; Tim Tingkang Xia, Esq.

(57) ABSTRACT

A server casing includes a case body, a HDD cage and a backplane assembly. The case body has an opening and an accommodation space connected to the opening. The HDD cage can be inserted into and removed from the accommodation space through the opening. The HDD cage has installation spaces for accommodating the hard disk drives. The backplane assembly includes a connector and a HDD backplane fastened to the HDD cage and configured to be electrically connected to the hard disk drives. The HDD cage further has a front surface and a rear surface. The front surface is closer to the opening than the rear surface. The installation spaces are between the front surface and the rear surface. The HDD backplane extends beyond the rear surface in a direction away from the opening. The connector is located at one end of the HDD backplane extending beyond the rear surface.

9 Claims, 5 Drawing Sheets

SERVER CASING AND SERVER DEVICE

CROSS-REFERENCE TO RELATED APPLICATIONS

This non-provisional application claims priority under 35 U.S.C. § 119(a) on Patent Application No(s). 202111064006.1 filed in China, on Sep. 10, 2021, the entire contents of which are hereby incorporated by reference.

BACKGROUND OF THE INVENTION

Technical Field of the Invention

The invention relates to a server casing and a server device, more particular to a server casing having a removable HDD cage and a server device including the same.

Description of the Related Art

With the coming of the internet era, a variety of technology and device developments related to the internet are growing flourishly.

Usually, a conventional 2U 42-bay 3.5-inch HDD server includes two backplanes on each removable HDD cage thereof, and the two backplanes are respectively a 12-bay backplane and a 9-bay backplane. However, signal transmission cables and power supply cables connected between the two backplanes and connecting the backplanes and other components are arranged on the surface of the backplanes, and thus, the cables intersect and overlap one another, such that the cable routing among the backplanes and the case is overcrowded. As a result, when the HDD cage is removed or inserted into the case, the cables may be scratched by interior side walls of the case, and thus, it is difficult to move the HDD cage.

SUMMARY OF THE INVENTION

The invention provides a server casing and a server device, which provides smooth movements of the HDD cage when the HDD cage is removed from or inserted into the case body without being interfered by overlapping and stacked cables between the backplanes and the case body.

One embodiment of the invention provides a server casing. The server casing includes a case body, at least one HDD cage and at least one backplane assembly. The case body has an opening and at least one accommodation space connected to the opening. The HDD cage is removably disposed in the accommodation space, and the HDD cage can be inserted into and removed from the accommodation space through the opening. The HDD cage has a plurality of installation spaces configured for a plurality of hard disk drives to be disposed therein. The backplane assembly includes at least one HDD backplane and at least one connector. The HDD backplane is fastened to the HDD cage, and the HDD backplane is configured to be electrically connected to the hard disk drives. The HDD cage further has a front surface and a rear surface disposed opposite to each other. The front surface is located closer to the opening than the rear surface to the opening. The installation spaces are located between the front surface and the rear surface. The HDD backplane extends beyond the rear surface in a direction away from the opening, and the connector is located at one end of the HDD backplane extending beyond the rear surface in the direction away from the opening.

One embodiment of the invention provides a server device. The server device includes a server casing and a plurality of hard disk drives. The server casing includes a case body, at least one HDD cage and at least one backplane assembly. The case body has an opening and at least one accommodation space connected to the opening. The HDD cage is removably disposed in the accommodation space, and the HDD cage can be inserted into and removed from the accommodation space through the opening. The HDD cage has a plurality of installation spaces, and the hard disk drives are respectively disposed in the installation spaces. The backplane assembly includes at least one HDD backplane and at least one connector. The HDD backplane is fastened to the HDD cage, and the HDD backplane is electrically connected to the hard disk drives. The HDD cage further has a front surface and a rear surface disposed opposite to each other. The front surface is located closer to the opening than the rear surface to the opening, and the installation spaces are located between the front surface and the rear surface. The HDD backplane extends beyond the rear surface in a direction away from the opening, and the connector is located at one end of the HDD backplane extending beyond the rear surface in the direction away from the opening.

According to the server casing and the server device as discussed in the above embodiment, the connector is disposed at one end of the HDD backplane extending beyond the rear surface of the HDD cage, such that the position of the connector with a cable connected thereto is relatively close to the cable carrier located at the rear surface of the HDD cage. Therefore, since the number of cables on the surface of the backplane is reduced, the cable routing on the backplane can be simplified, which is favorable for cable organization, and the operation steps can be reduced. Also, since the cables do not overlap and stack on one another between the HDD backplane and the case body, the cables are prevented from scratching the case body and thus the movements of the HDD cage can be relatively smooth when the HDD cage is removed from or inserted into the accommodation space of the case body.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
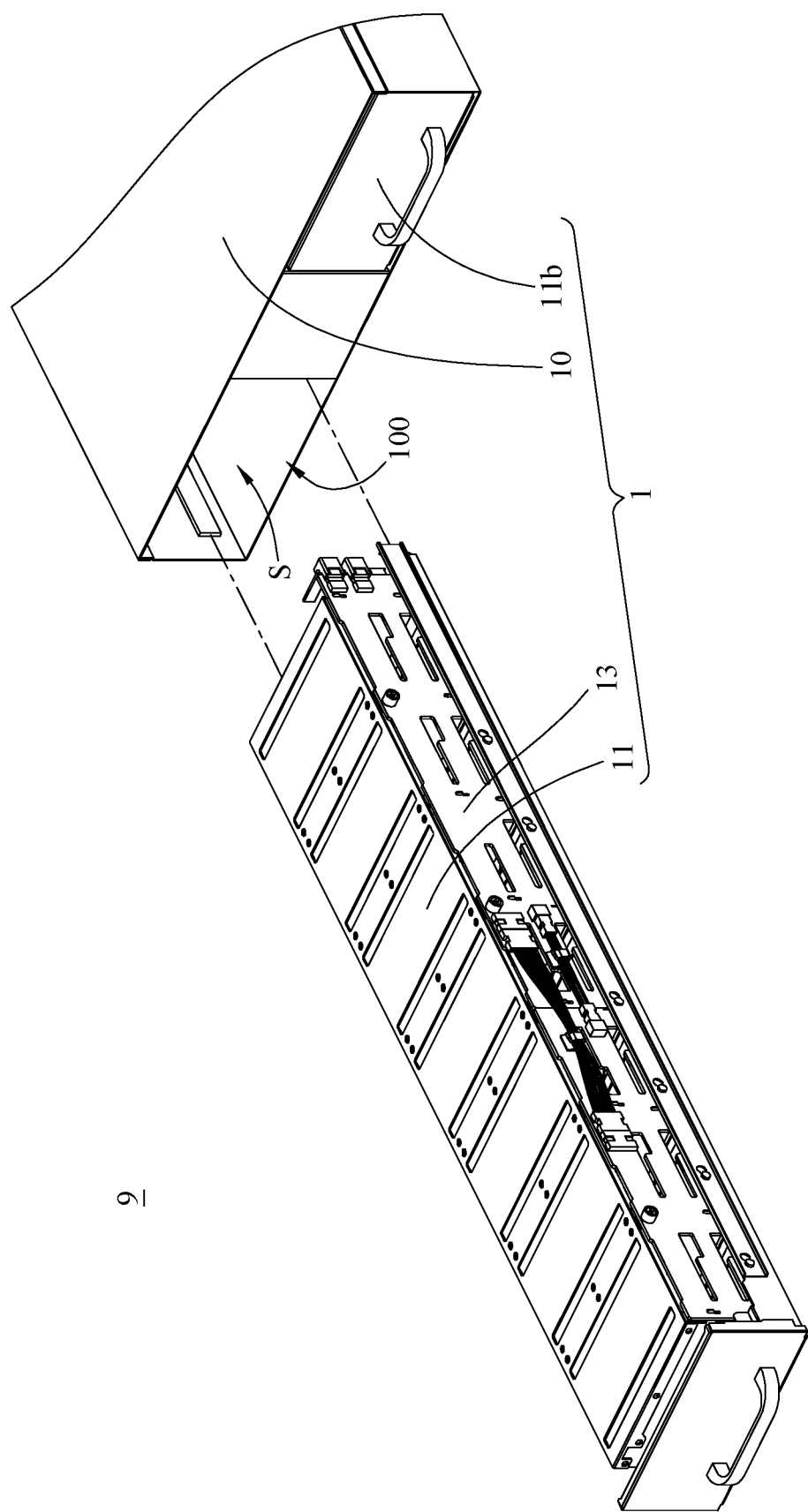
FIG. 1 is a perspective view of a server device according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
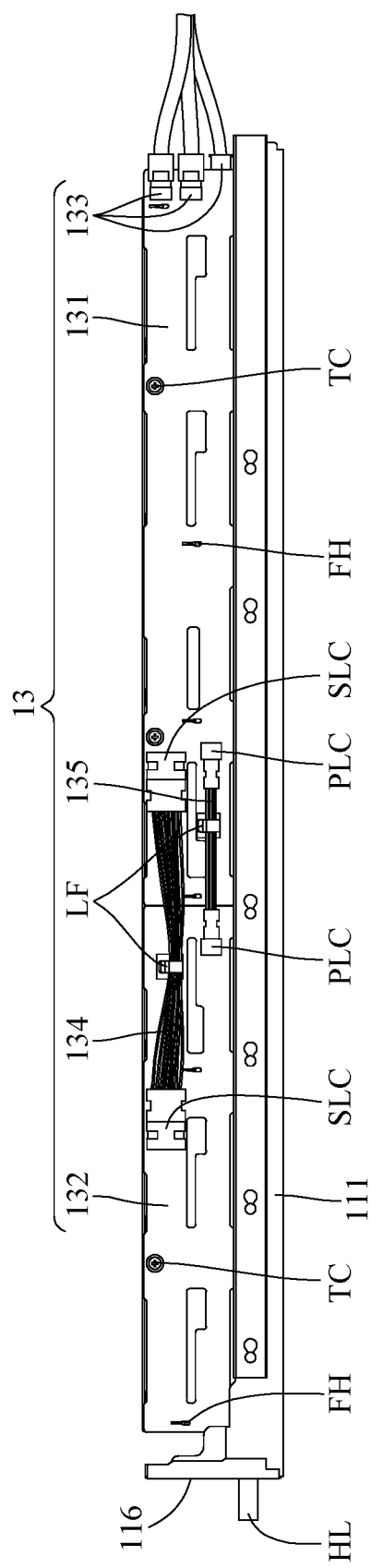
FIG. 2 is a side view of one of two HDD cages and one of two backplane assemblies of the server device in FIG. 1.
Figure 3:
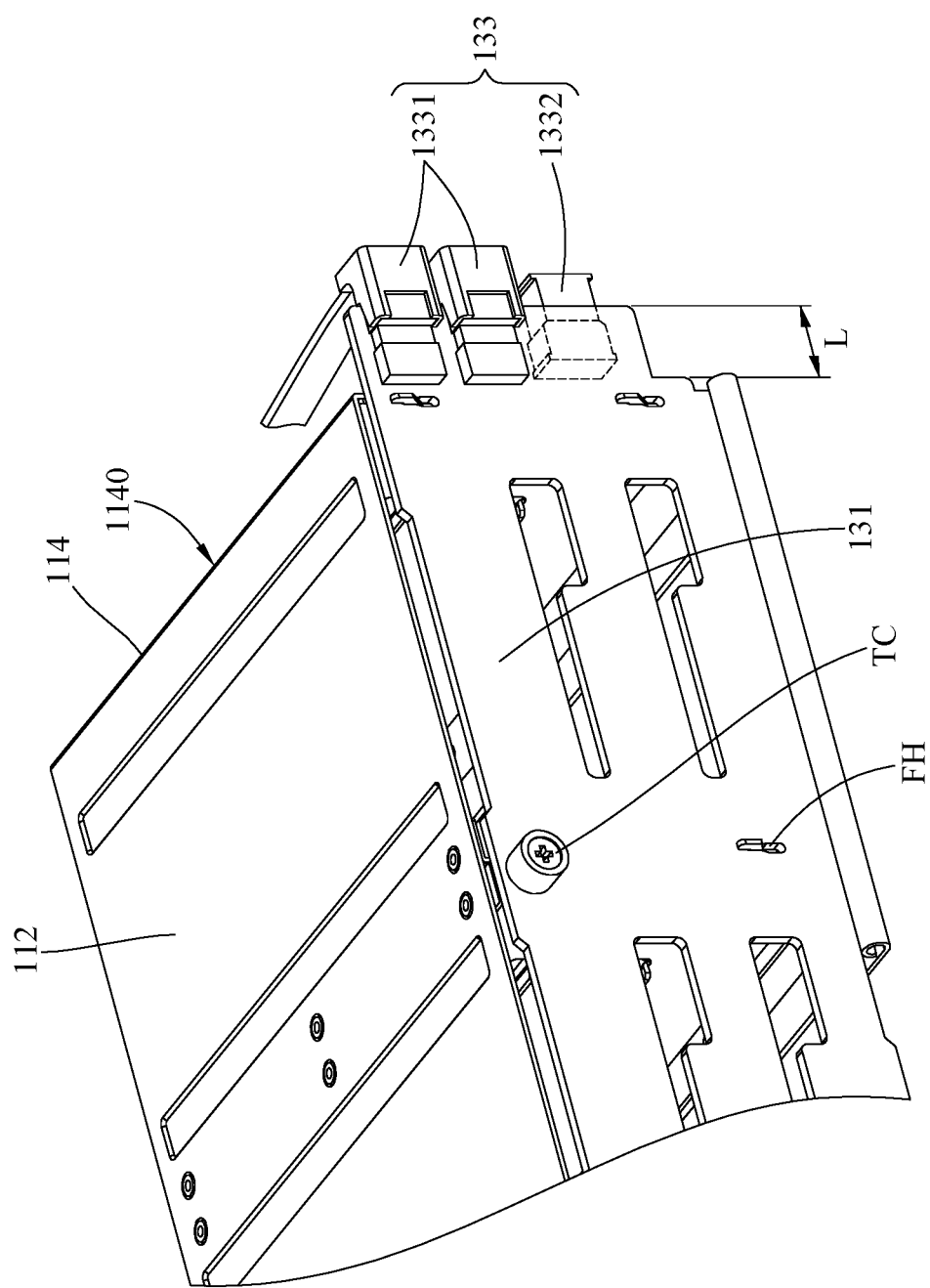
FIG. 3 is a partial enlarged view of one of the HDD cages and one of the backplane assemblies of the server device in FIG. 1.
Figure 4:
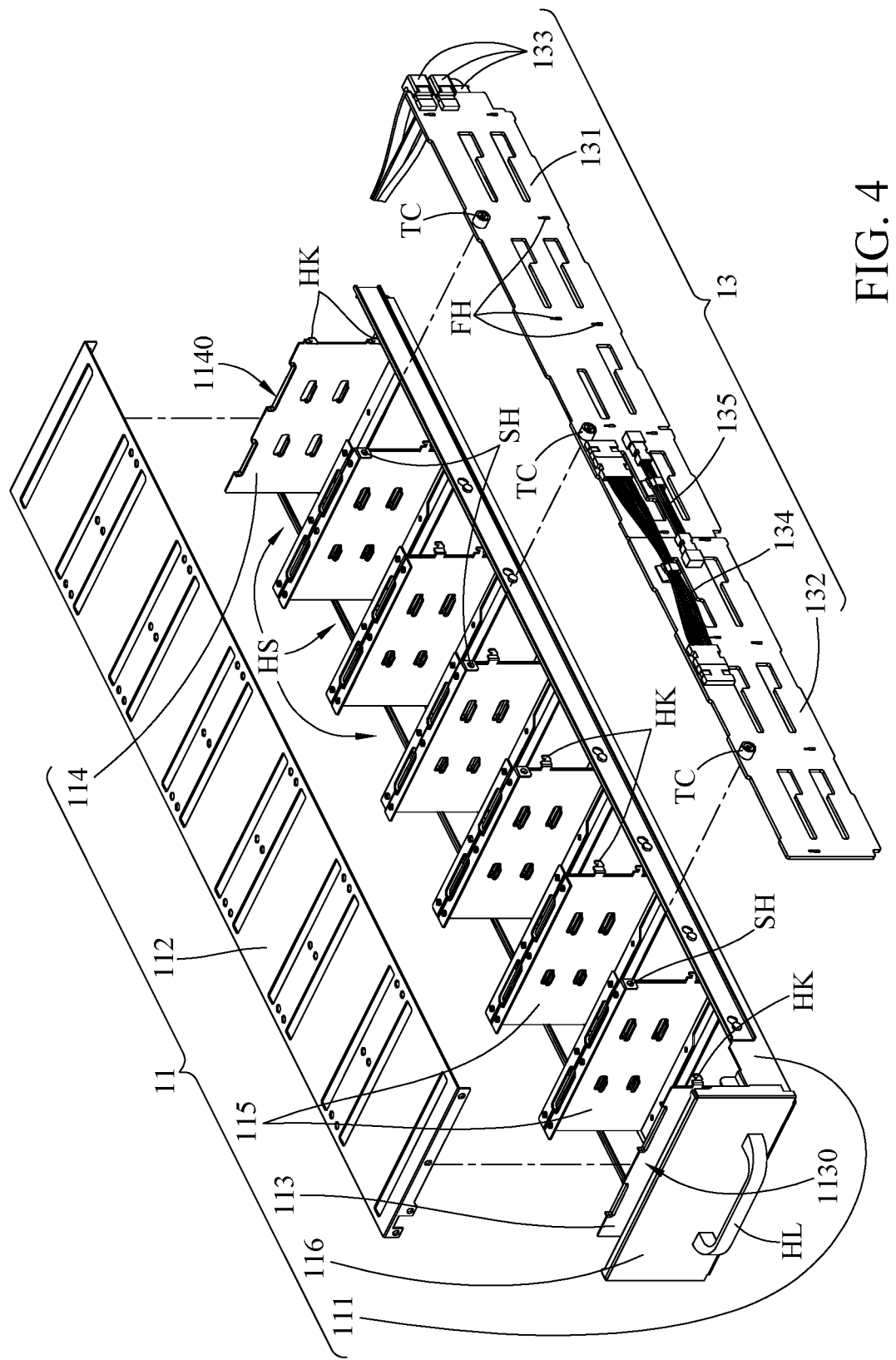
FIG. 4 is an exploded view of one of the HDD cages and one of the backplane assemblies of the server device in FIG. 1.
Figure 5:
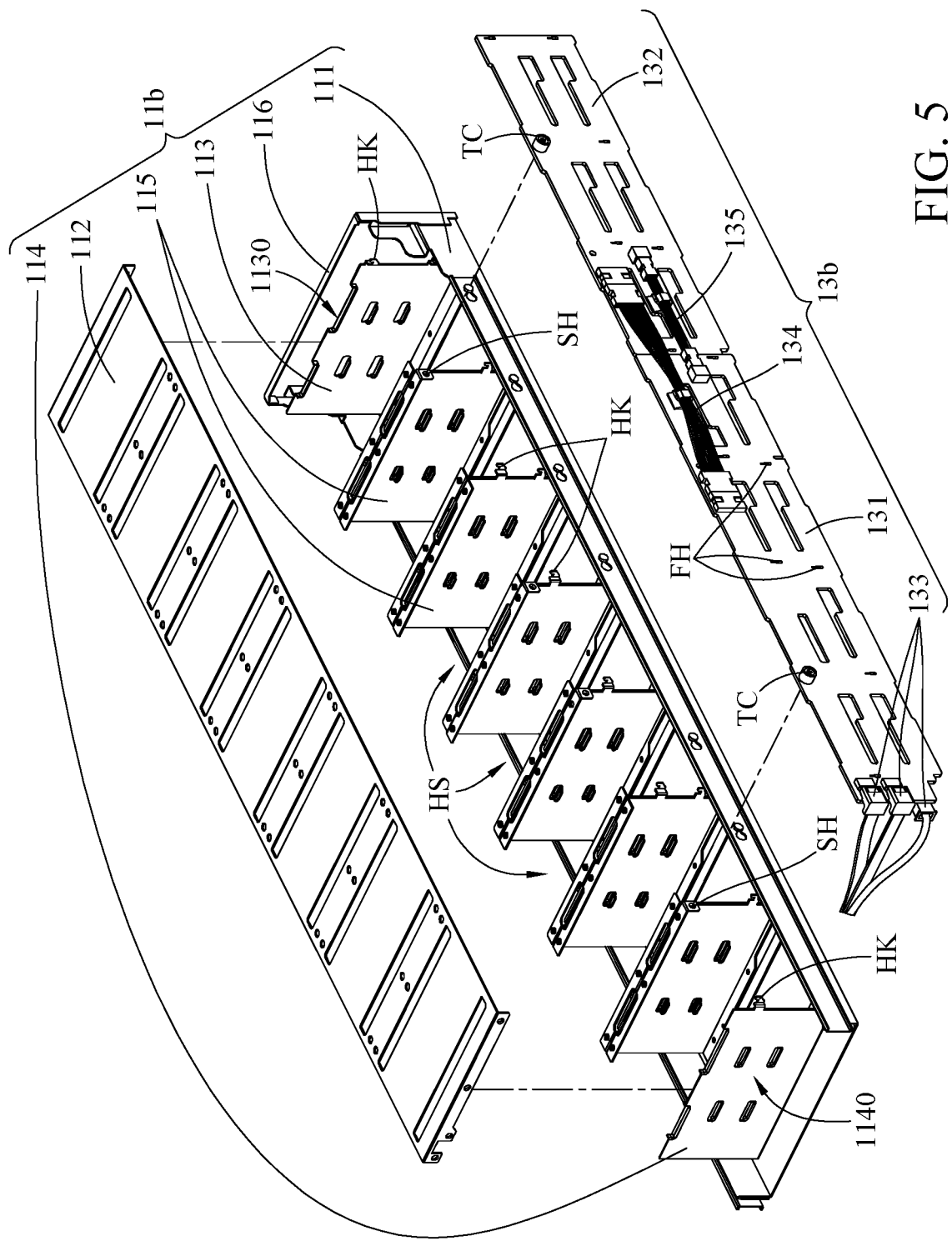
FIG. 5 is an exploded view of the other HDD cage and the other backplane assembly of the server device in FIG. 1.

Please refer to FIG. 1 to FIG. 5. FIG. 1 is a perspective view of a server device according to one embodiment of the invention, FIG. 2 is a side view of one of two HDD cages and one of two backplane assemblies of the server device in FIG. 1, FIG. 3 is a partial enlarged view of one of the HDD cages and one of the backplane assemblies of the server device in FIG. 1, FIG. 4 is an exploded view of one of the HDD cages and one of the backplane assemblies of the server device in FIG. 1, and FIG. 5 is an exploded view of the other HDD cage and the other backplane assembly of the server device in FIG. 1.

In this embodiment, a server device 9 is provided. The server device 9 includes a server casing 1 and a plurality of hard disk drives (not shown). In this embodiment, the server device 9 is a 2U server device provided with 42 3.5-inch hard disk drives, which can be applicable in a variety of fields such as big data storage. However, it is only exemplary, and the present invention is not limited thereto. In other embodiments, the server device can be a 1U server device or a 4U server device, and the server device may be provided with different numbers and types of hard disk drives.

The server casing 1 includes a case body 10, two HDD cages 11 and 11b, and two backplane assemblies 13 and 13b. The case body 10 has two openings 100 and two accommodation spaces S respectively connected to the openings 100.

The HDD cages 11 and 11b are respectively removably disposed in the accommodation spaces S of the case body 10, and the HDD cages 11 and 11b can be inserted into or removed from the accommodation spaces S through the openings 100, respectively. In this embodiment, each of the two HDD cages 11 and 11b can accommodate 21 3.5-inch hard disk drives in maximum.

Each of the HDD cages 11 and 11b includes a bottom plate 111, a top plate 112, a front plate 113, a rear plate 114 and a plurality of partitions 115. In each of the HDD cages 11 and 11b, the front plate 113 and the rear plate 114 are disposed opposite to each other, and the front plate 113 is located closer to the opening 100 than the rear plate 114 to the opening 100. Each of the HDD cages 11 and 11b has a plurality of installation spaces HS located between the front plate 113 and the rear plate 114 for accommodating the hard disk drives. In specific, the front plate 113 and the rear plate 114 are disposed opposite to each other and respectively connected to opposite sides of the bottom plate 111 and opposite sides of the top plate 112, and the front plate 113, the rear plate 114, the bottom plate 111 and the top plate 112 together surround the installation spaces HS. Furthermore, the partitions 115 are disposed between the front plate 113 and the rear plate 114 and between the bottom plate 111 and the top plate 112, and the partitions 115 separate the installation spaces HS from one another.

In this embodiment, each of the HDD cages 11 and 11b further includes a front cover 116 fixed on the bottom plate 111 and covering the front plate 113, and the front cover 116 is exposed to the outside through the opening 100. In addition, each of the front covers 116 is provided with a handle HL for users to conveniently pull the HDD cages 11 and 11b from the case body 10. In some embodiments, the front cover can be provided with several vent holes for dissipating heat generated by the hard disk drives of the server device.

Each of the backplane assemblies 13 and 13b includes a first HDD backplane 131, a second HDD backplane 132, three connectors 133, a slimline cable 134, a power line 135 and two cable fasteners LF.

The first HDD backplane 131 and the second HDD backplane 132 of the backplane assembly 13 are fastened to the HDD cage 11 and electrically connected to each other, and the first HDD backplane 131 and the second HDD backplane 132 of the backplane assembly 13b are fastened to the HDD cage 11b and electrically connected to each other. The first HDD backplane 131 is located farther away from the opening 100 of the case body 10 than the second HDD backplane 132 to the opening 100. The first HDD backplane 131 has a slimline port SLC and a powerline port PLC at one side thereof relatively close to the second HDD backplane 132, and the second HDD backplane 132 has a slimline port SLC and a powerline port PLC at one side thereof relatively close to the first HDD backplane 131. Two ends of the slimline cable 134 are respectively connected to the slimline port SLC of the first HDD backplane 131 and the slimline port SLC of the second HDD backplane 132, and two ends of the power line 135 are respectively connected to the powerline port PLC of the first HDD backplane 131 and the powerline port PLC of the second HDD backplane 132. The cable fasteners LF respectively fasten the slimline cable 134 and the power line 135 onto one of the HDD backplanes 131 and 132.

In this embodiment, the first HDD backplane 131 is a 12-bay HDD backplane configured for 12 hard disk drives to be electrically connected thereto, and the second HDD backplane 132 is a 9-bay HDD backplane configured for 9 hard disk drives to be electrically connected thereto, but the present invention is not limited thereto. In other embodiments, the first HDD backplane may be a 9-bay HDD backplane, and the second HDD backplane may be a 12-bay HDD backplane. Furthermore, in other embodiments, the first HDD backplane and the second HDD backplane may be HDD backplanes with various numbers of bays.

The first HDD backplane 131 and the second HDD backplane 132 respectively have a plurality of the fastening holes FH and a plurality of thumbscrews TC. One side of each of the front plate 113, the rear plate 114 and the partitions 115 relatively close to the first HDD backplane 131 and the second HDD backplane 132 respectively have at least one hook HK. Moreover, some of the partitions 115 further have at least one screw hole SH, respectively. The fastening holes FH of the HDD backplanes 131 and 132 are respectively engaged with the hooks HK of the front plate 113, the rear plate 114 and the partitions 115, and the thumbscrews TC of the HDD backplanes 131 and 132 are respectively fastened into the screw holes SH of the partitions 115, such that the first HDD backplane 131 and the second HDD backplane 132 are fastened to the HDD cage 11 (or 11b) and electrically connected to the hard disk drives disposed in the installation spaces HS. Therefore, the first HDD backplane 131 and the second HDD backplane 132 are fastened by quick releasing means, so that the HDD backplanes can be installed and removed more easily. Note that the aforementioned means that fastens the HDD backplanes onto the HDD cage may be modified as required. In other embodiments, the HDD backplane may be fastened to the HDD cage by other fastening means such as quick release screws or snap-fit manner.

The front plate 113 has a front surface 1130, and the rear plate 114 has a rear surface 1140. The front surface 1130 and the rear surface 1140 face away from each other. In other words, the front surface 1130 faces the opening 100 and faces the outside of the case body 10, while the rear surface 1140 faces away from the opening 100 and faces the inside of the case body 10.

The first HDD backplane 131 extends beyond the rear surface 1140 in a direction away from the opening 100, and a cable management space is formed between the rear surface 1140 and the part of the first HDD backplane 131 extending beyond the rear surface 1140. Therefore, the space for cable routing can be increased. In this embodiment, a length L of the part of the first HDD backplane 131 extending beyond the rear surface 1140 is 20 mm (as shown in FIG. 3, L=20 mm), but the present invention is not limited to thereto. In other embodiments, the length of the part of the first HDD backplane extending beyond the rear surface may range from 15 mm to 30 mm.

The three connectors 133 of each of the backplane assemblies 13 and 13b include two slimline cable connectors 1331 and a power connector 1332, and the slimline cable connectors 1331 and the power connector 1332 are located at the end of the first HDD backplane 131 extending beyond the rear surface 1140. The slimline cable connectors 1331 and the power connector 1332 are configured to be respectively connected to the I/O board (not shown) and a board management controller board (not shown) via three cables. Therefore, the positions of the connectors are relatively close to a cable carrier (not shown) located at the rear plate 114, so that the three cables can be easily gathered and organized and together inserted into the cable carrier. Furthermore, the cable routing on the HDD backplanes can be simplified, so that it is favorable for cable organization, and the operation steps can be reduced. Also, since the cables do not overlap and stack on one another between the HDD backplanes and the case body, the cables are prevented from being scratched by the case body and thus the movements of the HDD cages can be relatively smooth when the HDD cages are removed from or inserted into the accommodation spaces of the case body. In this embodiment, the slimline cable connectors 1331 and the power connector 1332 are respectively disposed on opposite surfaces of the first HDD backplane 131, but the present invention is not limited thereto. In other embodiments, the slimline cable connectors and the power connector may be disposed on the same surface of the first HDD backplane.

In this embodiment, the two HDD cages 11 and 11b respectively together with the backplane assemblies 13 and 13b are mirror-symmetrical to each other, components having the same functionality between the HDD cage 11 and the HDD cage 11b are identical or substantially the same in structure, and components having the same functionality between the backplane assembly 13 and backplane assembly 13b are identical or substantially the same in structure. Therefore, the HDD cage 11 and the HDD cage 11b can be substantially produced by the same mold to save the cost spending on modifying the mold or cages, thereby reducing manufacturing costs of the server casing 1. In addition, as shown in FIG. 4 and FIG. 5, the first HDD backplane 131 of the backplane assembly 13 and the first HDD backplane 131 of the backplane assembly 13b are substantially the same in structure, and the second HDD backplane 132 of the backplane assembly 13 and the second HDD backplane 132 of the backplane assembly 13b are substantially the same in structure. Therefore, since the first HDD backplanes 131 of the backplane assemblies 13 and 13b have the same or substantially the same specification, and the second HDD backplanes 132 of the backplane assemblies 13 and 13b have the same or substantially the same specification, the two first HDD backplanes 131 may be manufacturing by the same mold with slight modifications, and the two second HDD backplanes 132 may be manufacturing by the same mold with slight modifications, thereby reducing manufacturing costs of the server casing 1.

In this embodiment, each of the backplane assemblies 13 and 13b includes the number of two HDD backplanes 131 and 132 electrically connected to each other, but the present invention is not limited to the number of HDD backplanes in each backplane assembly as described above. In other embodiments, each backplane assembly may include one or more than three HDD backplanes.

In this embodiment, data signals are transmitted between the two HDD backplanes 131 and 132 by the slimline cable 134 connected between the two HDD backplanes 131 and 132, but the present invention is not limited thereto. In other embodiments, data signals can be transmitted between the HDD backplanes by other types of signal transmission cables connected between the HDD backplanes according to actual requirements.

In this embodiment, the slimline cable 134 and the power line 135 connected between the two HDD backplanes 131 and 132 are fastened to the HDD backplanes by the cable fasteners LF. However, it can be understood that the cable fasteners LF are optional, and the present invention is not limited thereto.

In this embodiment, the quantity of the accommodation spaces S of the case body 10 is two, the quantity of the HDD cages 11 and 11b is two, and the quantity of the backplane assemblies 13 and 13b is two, but the present invention is not limited thereto. In other embodiments, the quantity of each of the accommodation space, HDD cage and backplane assembly may be one or more than three.

According to the server casing and the server device as discussed in the above embodiment, the connector is disposed at one end of the HDD backplane extending beyond the rear surface of the HDD cage, such that the position of the connector with a cable connected thereto is relatively close to the cable carrier located at the rear surface of the HDD cage. Therefore, the cable routing on the backplane can be simplified because of the reduction of cables on the surface of the backplane, so that it is favorable for cable organization, and the operation steps can be reduced. Also, since the cables do not overlap and stack on one another between the HDD backplane and the case body, the cables are prevented from being scratched by the case body and thus the movements of the HDD cage can be relatively smooth when the HDD cage is removed from or inserted into the accommodation space of the case body.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:
1. A server casing, comprising:
   a case body, having an opening and at least one accommodation space connected to the opening;

at least one HDD cage, removably disposed in the at least one accommodation space, wherein the at least one HDD cage can be inserted into and removed from the at least one accommodation space through the opening, the at least one HDD cage has a plurality of installation spaces for accommodating a plurality of hard disk drives; and at least one backplane assembly, comprising at least one HDD backplane and at least one connector, wherein the at least one HDD backplane is fastened to the at least one HDD cage, and the at least one HDD backplane is configured to be electrically connected to the plurality of hard disk drives;

wherein the at least one HDD cage further has a front surface and a rear surface disposed opposite to each other, the front surface is located closer to the opening than the rear surface to the opening, the plurality of installation spaces are located between the front surface and the rear surface, the at least one HDD backplane extends beyond the rear surface in a direction away from the opening, and the at least one connector is located at one end of the at least one HDD backplane extending beyond the rear surface in the direction away from the opening; and wherein a length of a part of the at least one HDD backplane extending beyond the rear surface ranges from 15 mm to 30 mm, and a cable management space is formed between the rear surface and the part of the at least one HDD backplane extending beyond the rear surface.

2. The server casing according to claim 1, wherein the at least one HDD backplane comprises a first HDD backplane and a second HDD backplane electrically connected to each other, the first HDD backplane is located farther away from the opening of the case body than the second HDD backplane to the opening of the case body, the first HDD backplane extends beyond the rear surface in the direction away from the opening, and the at least one connector is located at one end of the first HDD backplane extending beyond the rear surface in the direction away from the opening.

3. The server casing according to claim 2, wherein the at least one backplane assembly further comprises a slimline cable and a power line, the first HDD backplane has a slimline port and a powerline port at one side thereof relatively close to the second HDD backplane, the second HDD backplane has a slimline port and a powerline port at one side thereof relatively close to the first HDD backplane, two ends of the slimline cable are respectively connected to the slimline port of the first HDD backplane and the slimline port of the second HDD backplane, two ends of the power line are respectively connected to the powerline port of the first HDD backplane and the powerline port of the second HDD backplane, the at least one connector comprises two slimline cable connectors and a power connector, and the slimline cable connectors and the power connector are located at the end of the first HDD backplane extending beyond the rear surface in the direction away from the opening.

4. The server casing according to claim 3, wherein the at least one backplane assembly further comprises two cable fasteners, and the cable fasteners respectively fasten the slimline cable and the power line onto the at least one HDD backplane.

5. The server casing according to claim 1, wherein the at least one HDD backplane has a plurality of fastening holes and at least one thumbscrew, the at least one HDD cage further has a plurality of hooks and at least one screw hole, the plurality of fastening holes are respectively engaged with the plurality of hooks, and the at least one thumbscrew is fastened into the at least one screw hole.

6. The server casing according to claim 5, wherein at least one HDD cage comprises a bottom plate, a top plate, a front plate, a rear plate and a plurality of partitions, the front plate and the rear plate are disposed opposite to each other and respectively connected to opposite sides of the bottom plate and opposite sides of the top plate, the front plate, the rear plate, the bottom plate and the top plate together surround the plurality of installation spaces, the front surface is located at the front plate, the rear surface is located at the rear plate, the plurality of partitions are disposed between the front plate and the rear plate and between the bottom plate and the top plate, the plurality of partitions separate the plurality of installation spaces, the plurality of hooks are respectively located at the front plate, the rear plate and the plurality of partitions, and the at least one screw hole is located at one of the plurality of partitions.

7. The server casing according to claim 1, wherein a quantity of the at least one accommodation space is two, a quantity of the at least one HDD cage is two, a quantity of the at least one backplane assembly is two, and the two HDD cages together with the backplane assemblies are mirror-symmetrical to each other.

8. The server casing according to claim 7, wherein the at least one HDD backplane of one of the two backplane assemblies and the at least one HDD backplane of the other backplane assembly are the same in structure.

9. A server, comprising:
a server casing, comprising:
a case body, having an opening and at least one accommodation space connected to the opening;
at least one HDD cage, removably disposed in the at least one accommodation space, wherein the at least one HDD cage can be inserted into and removed from the at least one accommodation space through the opening, and the at least one HDD cage has a plurality of installation spaces; and
at least one backplane assembly, comprising at least one HDD backplane and at least one connector, wherein the at least one HDD backplane is fastened to the at least one HDD cage; and
a plurality of hard disk drives, respectively disposed in the plurality of installation spaces, wherein the plurality of hard disk drives are electrically connected to the at least one HDD backplane;
wherein the at least one HDD cage further has a front surface and a rear surface disposed opposite to each other, the front surface is located closer to the opening than the rear surface to the opening, the plurality of installation spaces are located between the front surface and the rear surface, the at least one HDD backplane extends beyond the rear surface in a direction away from the opening, and the at least one connector is located at one end of the at least one HDD backplane extending beyond the rear surface in the direction away from the opening; and
wherein a length of a part of the at least one HDD backplane extending beyond the rear surface ranges from 15 mm to 30 mm, and a cable management space is formed between the rear surface and the part of the at least one HDD backplane extending beyond the rear surface.

* * * * *